(12) United States Patent
Kahen

(10) Patent No.: US 7,605,062 B2
(45) Date of Patent: Oct. 20, 2009

(54) DOPED NANOPARTICLE-BASED SEMICONDUCTOR JUNCTION

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/678,734

(22) Filed: Feb. 26, 2007

(65) Prior Publication Data

US 2008/0206972 A1 Aug. 28, 2008

(51) Int. Cl.
 *H01L 21/20* (2006.01)
(52) U.S. Cl. .................. 438/502; 438/492; 438/499; 977/892; 117/56; 257/E21.12; 257/E21.133
(58) Field of Classification Search ................. 438/499, 438/492, 502; 977/892; 117/56; 257/E21.114, 257/E21.12, E21.132, E21.133
See application file for complete search history.

(56) References Cited

U.S. PATENT DOCUMENTS

| 5,537,000 | A | 7/1996 | Alivisatos et al. | |
|---|---|---|---|---|
| 7,087,832 | B2* | 8/2006 | Scher et al. | 136/250 |
| 7,294,449 | B1* | 11/2007 | Gudeman et al. | 430/270.1 |
| 2002/0023894 | A1 | 2/2002 | Rossi | |
| 2005/0150541 | A1 | 7/2005 | Scher et al. | |

FOREIGN PATENT DOCUMENTS

| WO | 2005/094271 | 10/2005 |
|---|---|---|
| WO | 2006/116337 | 11/2006 |

OTHER PUBLICATIONS

Tang et al, Organic electroluminescent diodes, Appl. Phys. Lett. 51, 913-915 (1987).
O. Masala et al, Synthesis Routes for Large Volumes of Nanoparticles, Annu. Rev. Mater. Res. 34, (2004) pp. 41-81.
Pradham et al, Colloidal CdSe Quantum Wires by Oriented Attachment, Nano Letters, vol. 6, No. 4, pp. 720-724, 2006.
R. J. Jouet et al, Surface Passivation of Bare Aluminum Nanoparticles Using Perfluoroalkyl Carboxylic Acids, Chem. Mater. 17, pp. 2987-2996 (2005).
Murray et al, Synthesis and Characterization of Nearly Monodisperse CdE (E=S, Se, Te) Semiconductor Nanocrystallites, J. Am Chem, 1993, 115 pp. 8706-8715.
Liu et al, Employing End-Functional Polythiophene to Control the Morphology of Nanocrystal-Polymer Composites in Hybrid Solar Cells, J. Am. Chem. Soc. 2004, 126, pp. 6550-6551.
Huang et al, Low voltage organic electroluminescent devices using pin structures, App. Phys. Lett. V.80, No. 1, Jan. 2002, pp. 139-141.
Gur et al, Air Stable All Inorganic Nanocrystal Solar Cells Processed From Solution, Science, Vo. 310, Oct. 2005, 462-465.
Erwin et al, Doping semiconductor nanocrystals, Nature Letters, V43617, Jul. 2005, pp. 91-94.
Dhere et al, Thin-film photovoltaics, J. Vac. Sci. Tech. A23(4) Jul./Aug. 2005, pp. 1208-1214.
M. A. Hines et al, Bright UV-Blue Luminescent Colloidal ZnSe Nanocrystals, J. Phys. Chem. B102 pp. 3655-3657 (1998).
JV Singh et al, Synthesis and Characterization of Some Alkoxide Derivatives of Copper (II), Z. anorg.allg.Chem, 477 pp. 235-240 (1981).
Yu et al n-Type Conducting CdSe Nanocrystal Solids, Science, vol. 300, May 2003, pp. 1277-1280.
Hambrock et al, A non-aqueous organometallic route to highly monodispersed copper nanoparticles using [Cu(OCHChMe)CH$_2$NMe$_2$)$_2$], Chem. Commun. pp. 68-69 (2002).
C. B. Murray et al., Synthesis and Characterization of Monodisperse Nanocrystals and Close-Packed Nanocrystal Assemblies, Annu. Rev. Mater. Sci. 30, 545-593 (2000).
A. N. Goldstein et al., Melting in Semiconductor Nanocrystals, Science 256, 1425-1426 (1992).
K. B. Kahen, Rigorous optical modeling of multilayer organic light-emitting diode devices, Appl. Phys. Lett. 78, 1649-1651 (2001).
P. J. George et al., Doping of chemically deposited intrinsic CdS thin films to n type by thermal diffusion of indium, Appl. Phys. Lett. 66, 3624-3626 [1995].
Rossetti et al, Size effects in the excited electronic states of small colloidal CdsS crystallites, J. Chem Phys, Vo. 80, No. 9, May 1, 1984, pp. 4464-4469.
Tang et al, Spontaneous Organization of Single CdTe Nanoparticles into Luminescent Nanowires, Science, vol. 297, pp. 237-240, 2002.
M. Hilgendorff, et al., "From ZnO Colloids to Nanocrystalline Highly Conductive Films", Journal of the Electrochemical Society, Electrochemical Society, Manchester, New Hampshire, vol. 145, No. 10, Oct. 1, 1998, pp. 3632-3637.

* cited by examiner

*Primary Examiner*—Matthew Smith
*Assistant Examiner*—Julio J Maldonado
(74) *Attorney, Agent, or Firm*—Raymond L. Owens

(57) ABSTRACT

A doped semiconductor junction for use in an electronic device and a method for making such junction is disclosed. The junction includes a first polycrystalline semiconductor layer doped with donors or acceptors over a substrate such that the first doped semiconductor layer has a first polarity, the first layer including fused semiconductor nanoparticles; and a second layer in contact with the first semiconductor layer over a substrate to form the semiconductor junction.

6 Claims, 10 Drawing Sheets

DOPED NANOPARTICLE-BASED SEMICONDUCTOR JUNCTION

This invention was made with Government support under Cooperative Agreement #DE-FC26-06NT42864 awarded by DOE. The Government has certain rights in this invention.

CROSS-REFERENCE TO RELATED APPLICATIONS

Reference is made to commonly assigned U.S. patent application Ser. No. 11/668,041 filed Jan. 29, 2007, entitled "Doped Nanoparticle Semiconductor Charge Transport Layer" by Keith B. Kahen, and U.S. patent application Ser. No. 11/677,794 filed Feb. 23, 2007, entitled "Ex-Situ Doped Semiconductor Transport Layer" by Keith B. Kahen, the disclosures of which are incorporated herein.

FIELD OF THE INVENTION

The present invention relates to doped semiconductor junctions containing nanoparticles and a method for making such junctions.

BACKGROUND OF THE INVENTION

A variety of semiconductor devices, such as, bipolar transistors, rectifying diodes, light emitting diodes (LEDs), lasers, photodetectors, solar cells and others, require the formation of doped semiconductor junctions for their operation. Most semiconductor devices in use today, both inorganic and organic, are in part or completely formed using expensive vacuum deposition processes. There are ongoing efforts to find a low cost manufacturing process, but to date, device performance has been inadequate for market needs. Therefore, there is a need for a low cost technique of forming high quality inorganic doped semiconductor junctions for use in semiconductor devices.

In general, both n-type and p-type materials can be referred to as charge transport materials, and the layers of a device containing such materials can be referred to as charge transport layers. An n-type material typically has an excess of conduction band electrons, and as such is also referred to as an electron transport material. Furthermore, an n-type semiconductor is a semiconductor in which electrical conduction is due chiefly to the movement of electrons. A p-type material typically has an excess of "holes", and as such is also referred to as a hole transport material. Furthermore, a p-type semiconductor is a semiconductor in which electrical conduction is due chiefly to the movement of positive holes. The doping levels of the charge transport layers are typically set so that they are highest when the layers are in contact with metals (in order to assist in forming ohmic contacts). In the case where the layers are in contact with the anode or cathode, the charge transport layers are also typically called contact layers.

Semiconductor diode devices have been in use since the late 1800s. Most modern diode technologies are based on semiconductor p-n junctions, or contact between p-type and n-type semiconductors. However, many types of electronics would benefit from lower cost doped semiconductor junctions.

In the field of photovoltaic devices, current devices employ thin layers of semiconductor material, e.g., crystalline silicon, gallium arsenide, or the like, incorporating a p-n junction to convert solar energy to direct current. While these devices are useful in certain applications, their efficiency has been somewhat limited, yielding conversion efficiencies, e.g., solar power to electrical power, of typically marginally better than 10-20%. Although efficiencies of these devices have been improving through costly improvements to device structure, the relative inefficiency of these devices, combined with their relatively high cost, have combined to inhibit the widespread adoption of solar electricity in the consumer markets. Instead, such systems have been primarily used where conventionally generated electricity is unavailable, or where costs associated with bringing conventionally generated electricity, to a location where it is needed, more closely match the costs of photovoltaic systems.

Despite the issues with current photovoltaic technology, there is still a desire and a need to expand usage of solar electricity. In particular, there is generally a need for an improved photovoltaic cell that has one or more of: increased energy conversion efficiency, decreased manufacturing costs, greater flexibility or reasonable durability or longevity. In fact, as disclosed in U.S. Pat. No. 7,087,832 Scher et al. disclose the use of coatable nanoparticles in a polymer binder for use in photovoltaic devices. However, the performance of these devices were not reported, and the conductivity of such a mixed photoactive layer is expected to be low due to the high resistivity of the polymeric binder. An example of the performance of devices with these hybrid absorber layers is an efficiency of ~1.5% under AM 1.5 excitation (J. Liu et al., JACS 126, 6550 (2004)). Recently, an all inorganic solution processed solar cell was formed from CdSe and CdTe quantum rod nanoparticles, but again the efficiency was very low at 3% even after sintering the films at 400° C. for 15 minutes (I. Gur et., Science 310, 462 (2005)). A large part of the low efficiency was undoubtedly caused by the films being insulators (even after sintering) due to the lack of doping. For both CdTe and $CuIn_{1-x}Ga_xSe_{2-y}S$ (CIGSS) solar cells, the window layer is typically n-CdS (N. G. Dhere et al., J. Vac. Sci. Technol. A23, 1208 (2005)). Both doped and undoped forms of CdS have been used in the devices and a preferred deposition technique has been chemical bath deposition (CBD). Even though a solution processed technique, CBD involves dunking the entire wafer into a bath, which can be acidic or basic, for periods up to hours. In addition, the process is inefficient with respect to usage of its starting materials. In summary for the cited photovoltaic devices, either all or parts of the semiconductor junction were produced by low cost processes. However, either the resulting photovoltaic performance was sub-par or the deposition process had major drawbacks.

FIG. 1 gives a schematic of a typical prior art LED device 105 whose basis is a pin diode. All of the device layers are deposited on a substrate 100. Above the substrate 100 are a p-contact layer 110, a p-transport layer 120, an intrinsic emitter layer 130, a n-transport layer 140, and a n-contact layer 150. An anode 160 makes ohmic contact with the p-contact layer 110, while a cathode 170 makes ohmic contact with the n-contact layer 150. As is well-known in the art, LED structures typically contain doped n- and p-type transport layers, and more heavily doped n- and p-type contact layers. They serve a few different purposes. Forming ohmic contacts to semiconductors is simpler if the semiconductors are doped. Since the emitter layer is typically intrinsic or lightly doped, it is much simpler to make ohmic contacts to the doped transport layers. As a result of surface plasmon effects (K. B. Kahen, Appl. Phys. Lett. 78, 1649 (2001)), having metal layers adjacent to emitter layers results in a loss of emitter efficiency. Consequently, it is advantageous to space the emitter layers from the metal contacts by sufficiently thick (at least 150 nm) transport layers. Next it is advantageous to employ transport layers that not only can easily inject charge into the emitter layer, but also prevent the carriers from leaking back out of the emitter layer. As a consequence, the transport layers will have the largest bandgaps of the device layers. As is well known in the art, highly doping wide bandgap semiconductors is difficult as a result of self-compensation effects. Consequently, forming ohmic contacts to these layers can prove to be difficult. As a result, it is adventitious to add contact layers to the device whose bandgap is smaller than that of the transport layers. Beyond these advantages, doping the transport layers also reduces ohmic heating effects (which can be highly important for laser devices) and leads to larger separations of the corresponding n- or p-Fermi levels (which also aids laser, pin diode, and photovoltaic devices). The above discussion illustrates that having the ability to create doped semiconductor junctions results in numerous advantages for many semiconductor electronic devices.

LED devices have been made since the early 1960s and currently are manufactured for usage in a wide range of consumer and commercial applications. The layers comprising the LEDs are conventionally based on crystalline semiconductor materials that require ultra-high vacuum techniques for their growth, such as, metallo-organic chemical vapor deposition (MOCVD). In addition, the layers typically need to be grown on nearly lattice-matched substrates in order to form defect-free layers. These crystalline-based inorganic LEDs have the advantages of high brightness (due to layers with high conductivities), long lifetimes, good environmental stability, and good external quantum efficiencies. The high conductivities of the transport layers result from high mobilities (due to the crystalline nature of the films) and the ability to readily dope crystalline layers with donors and acceptors. The usage of crystalline semiconductor layers that results in all of these advantages also leads to a number of disadvantages. The dominant ones are high manufacturing costs, difficulty in producing multi-color output from the same chip, and the need for high cost and rigid substrates.

A way for forming low cost LEDs began in the 1980s with the introduction of organic light emitting diodes (OLED) (Tang et al, Appl. Phys. Lett. 51, 913 (1987)). The transport layers for these devices are highly resistive ($10^8$ ohm-cm) in comparison with those used in crystalline LEDs. Recent attempts at doping these layers (J. Huang et al., Appl. Phys. Lett. 80, 139 (2002)) have resulted in layer resistivities in the $10^4$-$10^6$ ohm-cm range. However, many of these dopants are unstable and the resistivities are many orders of magnitude higher than crystalline LED values of ~0.1 ohm-cm. The result of employing resistive layers is that one suffers from ohmic heating effects; it is difficult to make ohmic contacts; and since the drive current of the device is limited, so is the overall brightness of the device.

The above examples illustrate that higher performance semiconductor devices can be created from crystalline semiconductor materials; but with the drawback of high manufacturing costs. Attempts to reduce the manufacturing costs by employing organic materials result in lower performance devices whose specifications sometimes fall significantly short of market requirements (e.g., organic-based photovoltaics). Two approaches to lower the cost of crystalline semiconductor materials are to employ either amorphous or polycrystalline inorganic semiconductor materials; however, both of these approaches have well-known drawbacks. Taking the case of devices formed from amorphous Si, both thin-film transistor and photovoltaic (PV) devices have significantly reduced performance due to low mobilities (and the Staebler-Wronski effect for PVs). The performance of polycrystalline-based devices is improved with devices formed from processes, such as, sputtering and CBD. However, sputtering is a higher cost, vacuum-based deposition process and CBD, though chemically based, has long deposition times and is inefficient in its usage of starting materials, as stated previously.

The newest way for creating low cost semiconductor devices is to form the layers from inorganic semiconductor nanoparticles. To obtain the full advantage of these crystalline particles for usage in semiconductor transport layers, the nanoparticles should both be doped (to increase their intrinsic carrier concentration) and devoid of organic ligands on their surface (which impede charge transport). In spite of a plethora of reports about doping colloidal nanoparticles to modify their emission and magnetic characteristics (S. C. Erwin et al., Nature 436, 91 (2005)), there has been very limited research devoted to modifying the nanoparticle's carrier concentration (D. Yu et al., Science 300, 1277 (2003)). In the work of Yu et al. (D. Yu et al., Science 300, 1277 (2003)), even though they doped nanoparticle films, it was done by adding potassium through a high vacuum, post deposition, vacuum evaporation process. In general, even if nanoparticles are stripped of their insulating organic ligands by an annealing process, without added impurities atoms to modify the donor or acceptor concentrations, the resulting nanoparticles have limited conductivities (I. Gur et., Science 310, 462 (2005)). As a result, the corresponding semiconductor junctions incorporating these nanoparticles would have sub-par performance characteristics.

SUMMARY OF THE INVENTION

In accordance with the present invention there is provided a doped semiconductor junction for use in an electronic device comprising:

(a) a first polycrystalline semiconductor layer doped with donors or acceptors over a substrate such that the first doped semiconductor layer has a first polarity, the first layer including fused semiconductor nanoparticles; and (b) a second layer in contact with the first semiconductor layer over a substrate to form the semiconductor junction.

The doped semiconductor junction is formed by a method comprising:

(a) forming a first polycrystalline semiconductor layer doped with donors or acceptors over a substrate such that the first doped semiconductor layer has a first polarity, the first layer including semiconductor nanoparticles;

(b) forming a second layer in contact with the first semiconductor layer over a substrate to form the semiconductor junction; and (c) annealing the deposited first semiconductor layer either before or after forming the second layer.

The present invention employs doped inorganic nanoparticles to create doped semiconductor junctions for usage in a variety of electronic devices. The doped nanoparticles can be formed by either in-situ or ex-situ doping processes. The semiconductor junctions resulting from the doped nanoparticle layers show enhanced performance relative to analogous junctions incorporating undoped nanoparticles. Combining the ability to form doped semiconductor junctions using nanoparticles with the inherent low cost characteristics of nanoparticle-based electronics, results in low cost inorganic semiconductor devices having performance characteristics indicative of doped polycrystalline-based devices.

It is an advantage of the present invention to enable a simple method of forming doped semiconductor junctions comprised of nanoparticles. The semiconductor nanoparticles are doped either by in-situ or ex-situ processes. For the in-situ doping procedure, dopant materials are added during the process of synthetic growth of the colloidal nanoparticles. For the ex-situ doping procedure, a device layer is formed by coating on a surface a mixture of semiconductor and dopant material nanoparticles, wherein an anneal is performed to fuse the semiconductor nanoparticles and to enable dopant material atoms to diffuse out from the dopant material nanoparticles and into the fused semiconductor nanoparticle network. Semiconductor junctions composed of inorganic nanoparticles are typically highly resistive, which limits the usefulness of devices incorporating these junctions despite their low cost. By forming doped semiconductor junctions incorporating either in-situ or ex-situ doped inorganic nanoparticles, one can produce semiconductor junction devices at low cost while still maintaining good device performance. Doped semiconductor junctions help device performance by increasing the separation of the n- and p-Fermi levels, reducing ohmic heating, and aiding in forming ohmic contacts. By forming the doped semiconductor junction from inorganic nanoparticles, the device layers can be deposited by low cost processes, such as, drop casting, spin coating, or inkjetting. The resulting nanoparticle-based device can also be formed on a range of substrates, including flexible ones.

DETAILED DESCRIPTION OF THE INVENTION

Figure 1:
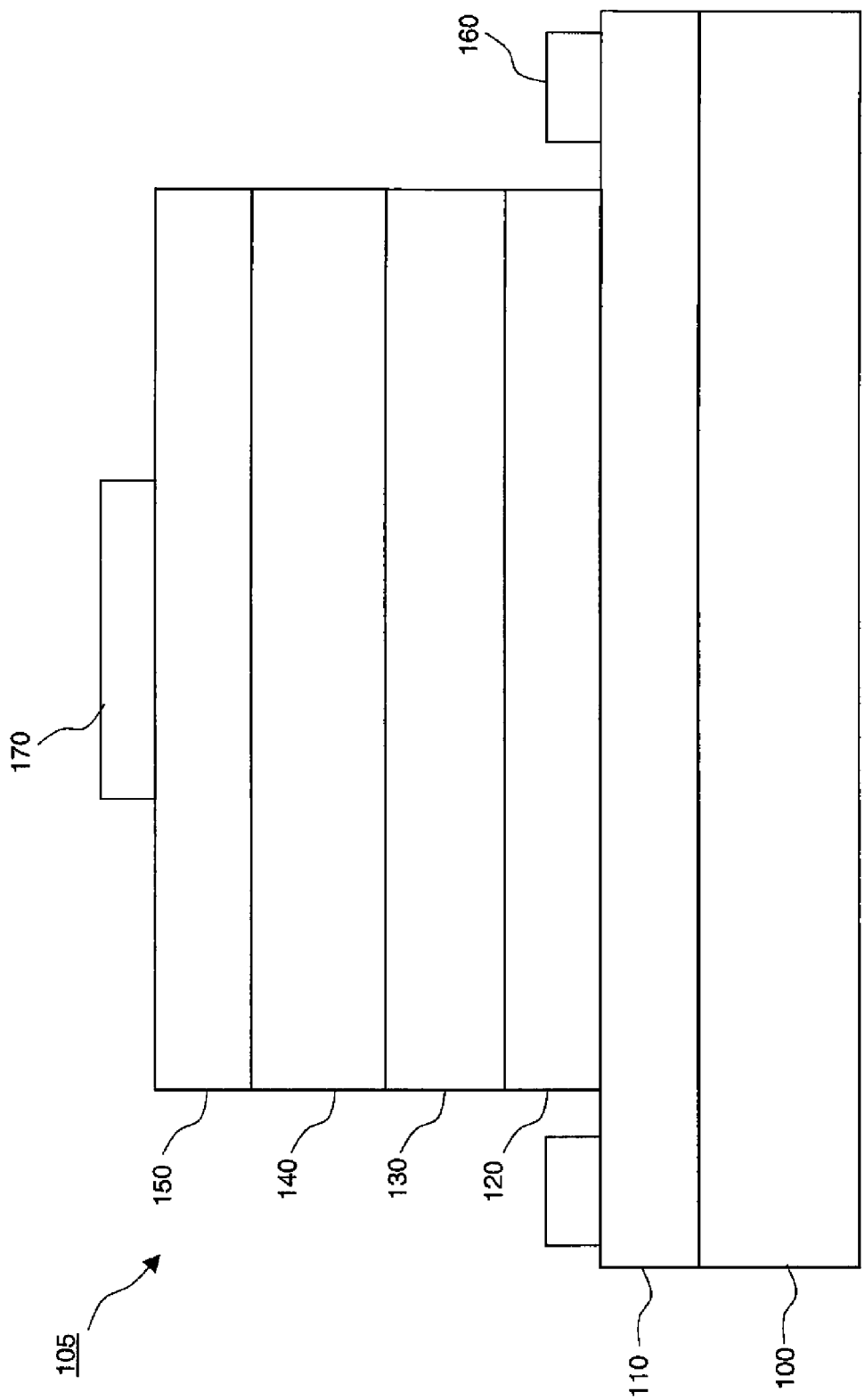
FIG. 1 shows a side-view schematic of a prior art inorganic light emitting device.
Figure 2:
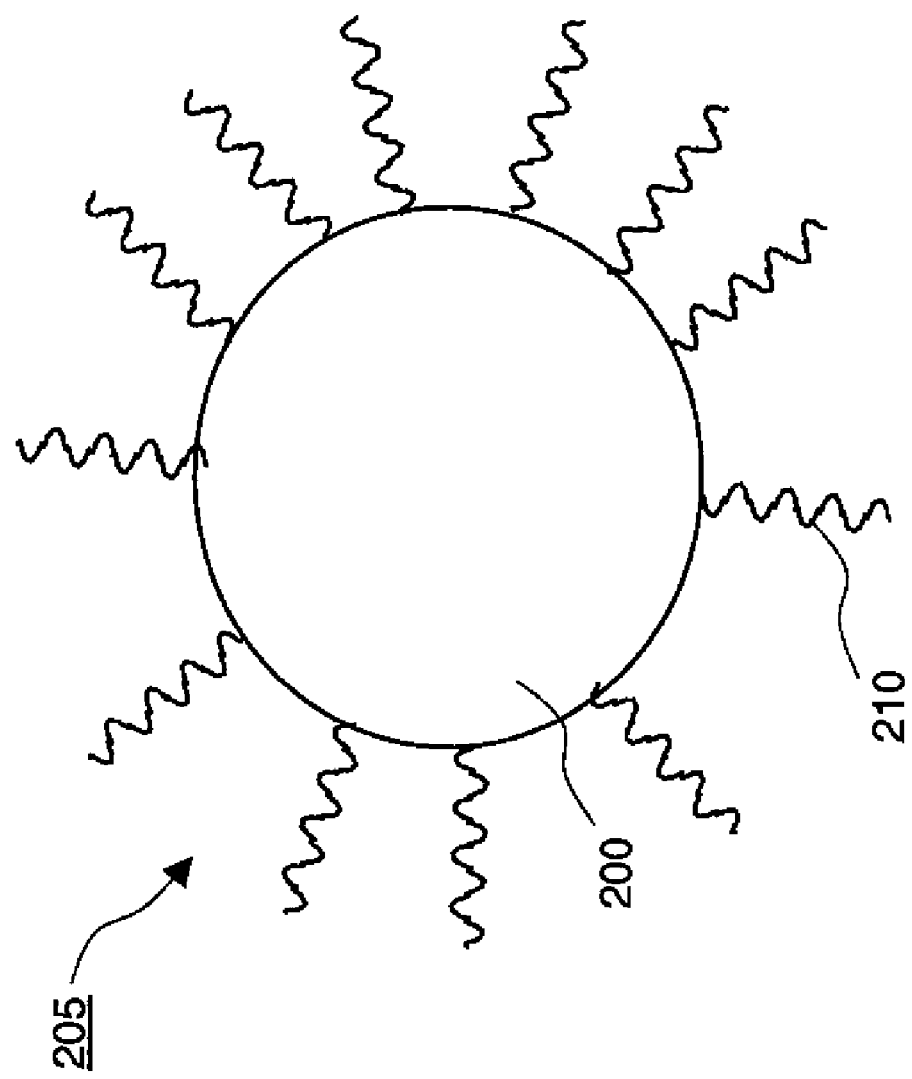
FIG. 2 shows a schematic of a colloidal inorganic nanoparticle.

It is desirable to form semiconductor electronic devices that not only have good performance, but also are low cost and can be deposited on arbitrary substrates. Using doped colloidal-based nanoparticles as the building blocks for doped semiconductor junctions would result in semiconductor electronic devices that confer these advantages. A typical colloidal inorganic nanoparticle 205 is shown in FIG. 2. In the figure, the inorganic nanoparticle 205 is composed of a semiconductor or metallic core 200, on whose surface is bonded organic ligands 210. The organic ligands 210 give stability to the resulting colloidal dispersion (the inorganic nanoparticle 205 and an appropriate solvent). Even though the inorganic nanoparticle 205 shown in FIG. 2 is spherical in shape, nanoparticles can be synthesized to be shapes ranging from quantum rods and wires, to tetrapods and other multiply connected nanoparticles that show quantum confinement effects.

Semiconductor films can be doped by a number of ways. Some of these are extrinsic processes (ex-situ), namely, the doping occurs after the materials comprising the layer have been grown or synthesized. For example, extrinsic donors and acceptors can be introduced into a layer by ion implantation and by diffusion processes (P. J. George et al., Appl. Phys. Lett. 66, 3624 (1995)). For the diffusion processes, the source for the dopant materials can be a solid source (metal on the layer surface), a liquid source (containing appropriate metal ions), and a vapor source (e.g., closed tube diffusions containing a subliming metallic source). Even though the semiconductor industry has a long history of implementing these extrinsic doping procedures, they involve extra processing steps, such as, removing the solid diffusion source once the diffusion process is complete. Another way for generating donors and acceptors is by creation of native defects. In compound semiconductors they can be generated by annealing the layers under appropriate overpressure conditions. In general this method is not preferred. The preferred doping approach is called in-situ doping that occurs when donors or acceptors are introduced into the materials during their synthesis. For crystalline semiconductors, in-situ doping has been highly successful, especially using the ultra high vacuum processes such as MOCVD and molecular beam epitaxy (MBE).

Adapting in-situ doping to inorganic nanoparticles 205 has a number of challenging issues associated with it. Foremost is the problem that doping levels are typically in the 1 part in $10^4$-$10^5$ range, while a 4 nm spherical nanoparticle only contains on the order of 1000 atoms (C. B. Murray et al., JACS 115, 8706 (1993)). As a result, many of the nanoparticles would not contain a dopant atom 310. This situation causes problems since if a large fraction of the nanoparticles are undoped, then these nanoparticles would be highly resistive which would result in the device layer being highly resistive. The only way to resolve this problem is to sinter the nanoparticles together to such a degree that the individuality of the separate nanoparticles is removed. Another issue is that incorporating impurity atoms in nanoparticles was shown to be difficult for certain crystal structures (S. C. Erwin et al., Nature 436, 91 (2005)), such as, zinc blende.

Figure 3:
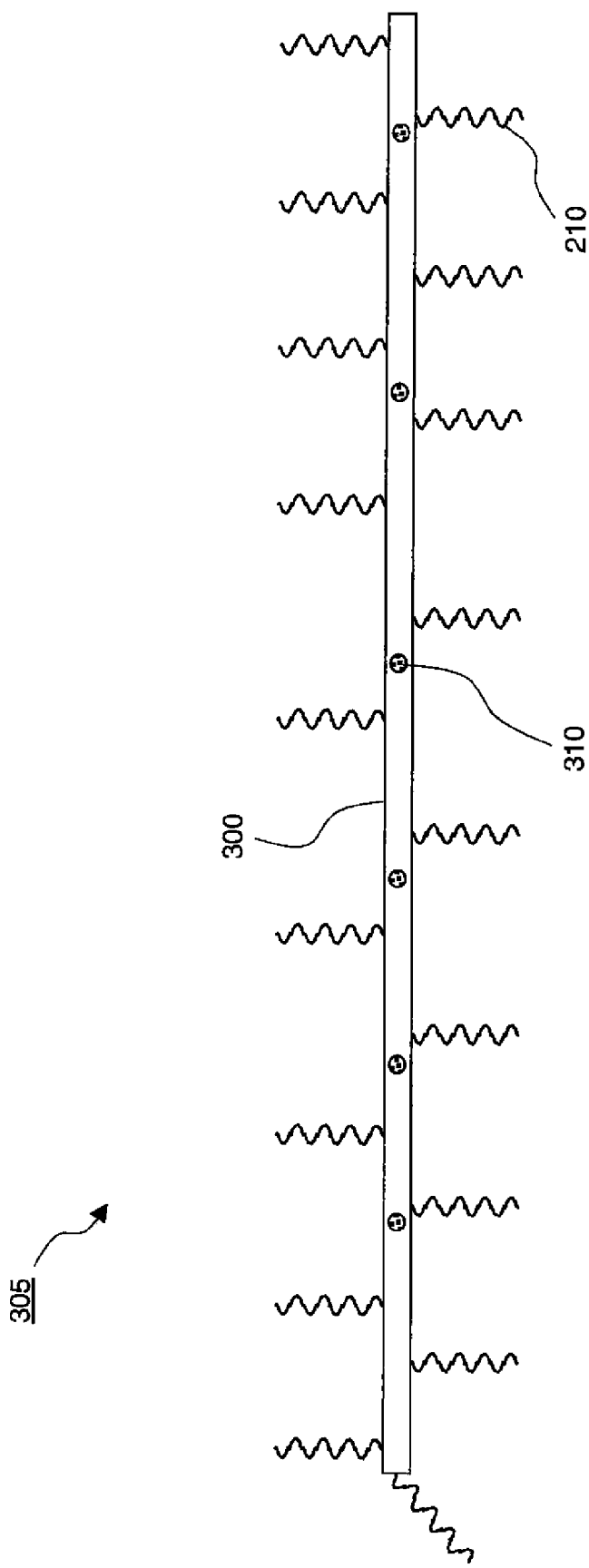
FIG. 3 shows a schematic of an in-situ doped quantum wire nanoparticle.

A strategy for dealing with these issues is to use quantum wires 300 as the doping platform (see FIG. 3). Quantum wires 300 have diameters of 1-20 nm, with lengths up to 1-10 μm. Taking the case of a quantum wire 300 with a diameter of 3 nm and a length of 1 μm, it would contain ~$3 \times 10^5$ atoms. Given the typical doping levels discussed above, this implies that each quantum wire 300 would contain many impurity atoms and, thus, would show reasonable conductance properties. With regard to the crystal structure question, quantum wires 300 of many compound semiconductors display the wurtzite structure (N. Pradhan et al., Nano Letters 6, 720 (2006)), despite the corresponding dots (eg., CdSe) having the zinc blende structure.

Colloidal quantum wires 300 can be grown by a few different processes. Quantum wires 300 with larger diameters can be grown by the solution-liquid-solid method (H. Yu et al., JACS 125, 16168 (2003)) and the nanoporous template methods (D. J. Pena et al., J. Phys. Chem. B106, 7558 (2002)). Colloidal quantum wires 300 with smaller diameters (which are preferred because they can be fused at lower temperatures) can be grown by the oriented attachment approach. This approach is so named since it refers to the phenomenon that generates quantum wires 300 by attaching existing spherical shaped nanoparticles along a given crystallographic direction. The nanoparticles which attach can either be pregrown in a separate reaction (Z. Tang et al., Science 297, 237 (2002)) or grown during the oriented attachment process (N. Pradhan et al., Nano Letters 6, 720 (2006)).

In order to illustrate the process of forming in-situ doped semiconductor nanoparticles 305, the semiconductor nanoparticle 205 will be taken as a II-VI compound. Doping these with column III elements, such as, Al, Ga, and In, results in n-type doping of the II-VI semiconductors. In choosing an appropriate chemical precursor for the n-type dopant atoms 310, it is preferred that it be matched to the reactivity of the cation precursor. For example, if the cation is Cd and its precursor is cadmium acetate, then a properly matched dopant atom 310 precursor would be indium acetate. In our experiments to date the dopant atom 310 precursors were added simultaneously with the cation precursor; however, as is well known in the art, the dopant atom 310 precursors could also be added at intervals during the quantum wire 300 growth process or dripped in continuously. It should be noted that choosing cation and dopant atom 310 precursors with different reactivities could also be successfully implemented. The three other cases for substitutional dopants are acceptors replacing the cations (e.g., Li for II-VI compounds), donors replacing the anions (e.g., Cl for II-VI compounds) and acceptors replacing the anions (e.g., N for II-VI compounds). In each of these three cases, analogous considerations hold between the reactivities of the dopant precursors and the reactivities of the cation/anion precursors. Lastly, the inorganic nanoparticle 205 can be other species besides quantum wires 300 as long as their atomic size is such that on average they contain more than one dopant species per nanoparticle. Possible nanoparticle species would be branched nanocrystals and other multiply connected nanoparticles that show quantum confinement effects.

In general the material composing the doped semiconductor layer can be selected from type II-VI, III-V, IV-VI, or IV semiconductor materials. Specific type IV semiconductors are Si, Ge, and Sn. Specific type III-V semiconductors are AlN, AlP, AlAs, and AlSb; GaN, GaP, GaAs, and GaSb; and InN, InP, InAs, and InSb. Specific II-VI semiconductors are ZnS, ZnSe, and ZnTe; CdS, CdSe, and CdTe, HgS, HgSe, and HgTe. Specific IV-VI semiconductors are PbS, PbSe, and PbTe. These various semiconductor materials can be in-situ doped by the following materials. For type IV semiconductors, the dopant atoms 310 can be selected from group III or V materials. For type III-V semiconductors, the dopant atoms 310 can be selected from group IIa, IIb, IV, or VI materials. For type II-VI semiconductors, the dopant atoms 310 can be selected from group Ia, Ib, III, V, or VII materials. For type IV-VI semiconductors, the dopant atoms 310 can be selected from group III, V, or VII materials.

Figure 4:
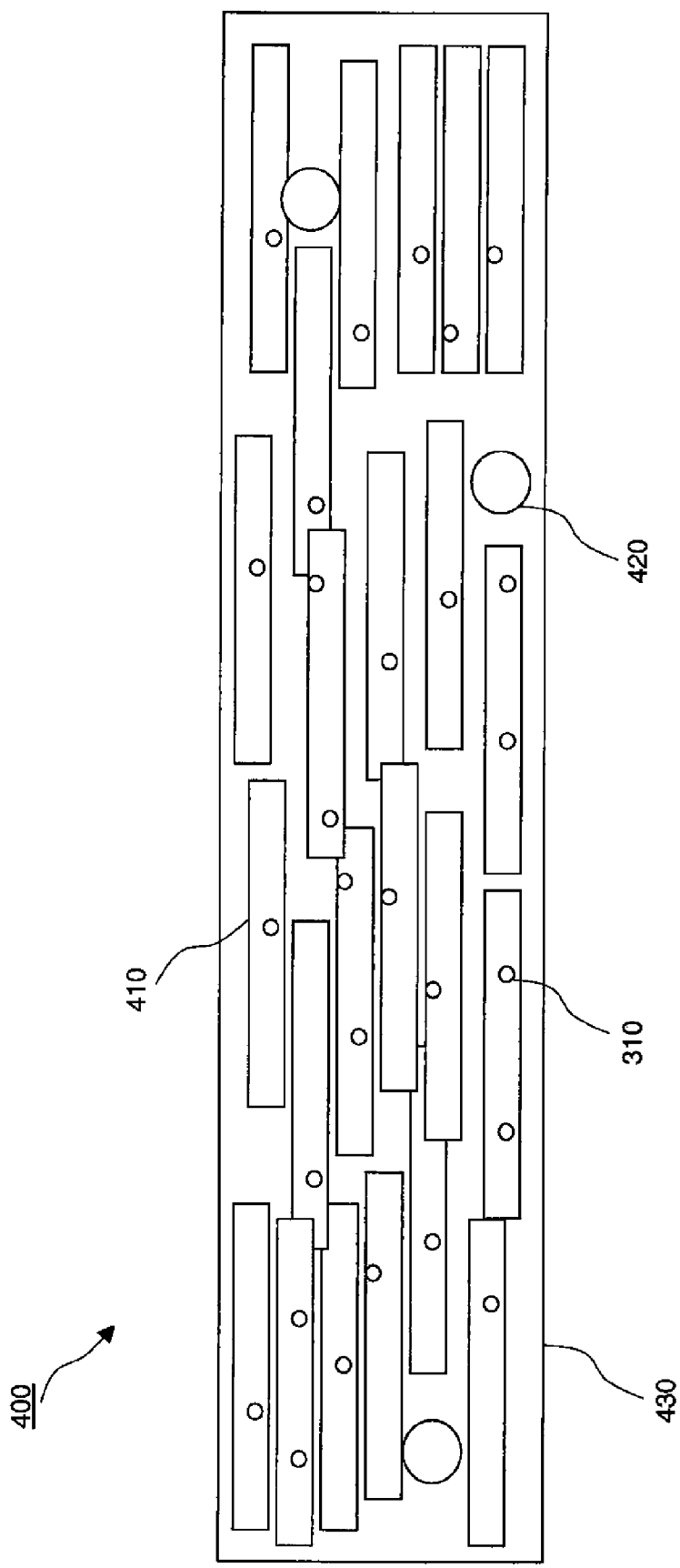
FIG. 4 shows a schematic of an ex-situ doped semiconductor charge transport layer containing semiconductor and dopant material nanoparticles.
Figure 5:
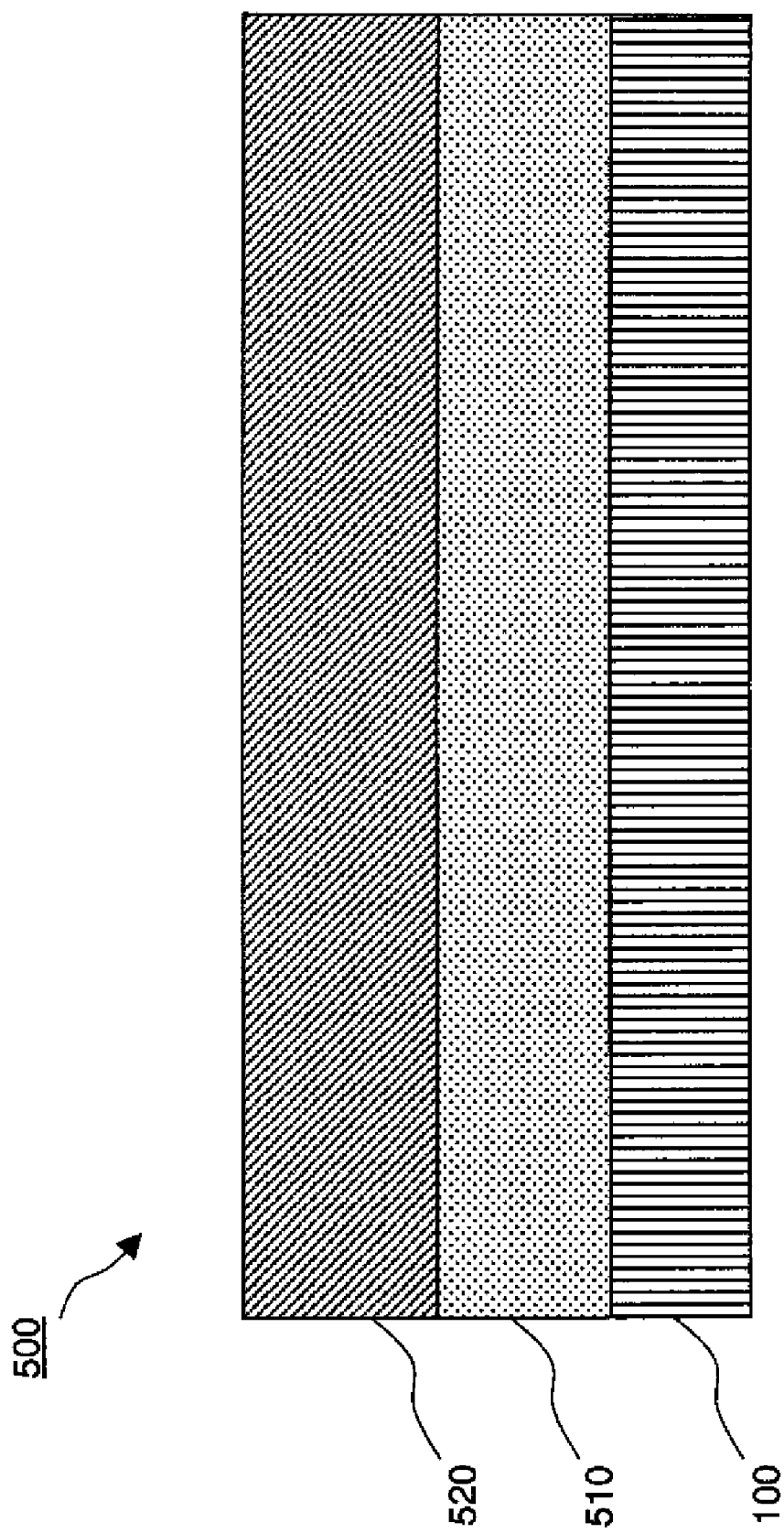
FIG. 5 shows a schematic of a doped semiconductor junction.

As discussed above, the other way for forming doped semiconductor layers is to employ an ex-situ doping procedure. A low cost, nanoparticle-based, ex-situ dopant diffusion process is discussed below (refer to FIG. 4). Instead of diffusing the dopant atoms 310 from sources external to a semiconductor layer 430, dopant material nanoparticles 420 are formed and co-dispersed with the semiconductor nanoparticles 410 such that the diffusion source for the dopant atoms 310 is internal to the semiconductor layer 430. In this fashion, each dopant material nanoparticle 420 inside of the semiconductor layer 430 acts as an internal source of dopant atoms 310. Two sets of anneals are performed on the semiconductor layer 430 containing semiconductor 410 and dopant material 420 nanoparticles. A lower temperature anneal (below 220° C.) is used to boil off the insulating organics ligands 210. A higher temperature anneal (between 250 and 500° C.) is used to fuse the semiconductor nanoparticles 410, resulting in a continuous semiconductor layer, and simultaneously causes the dopant atoms 310 to diffuse out from the dopant material nanoparticles 420 and into the continuous semiconductor layer to provide appropriate doping so that an ex-situ doped semiconductor layer 400 is formed. Having an internal source for the dopant atoms 310 has a few advantages over conventional methods: 1) A separate anneal step is not required to diffuse the dopants, since it occurs during the fusing of the semiconductor nanoparticles 410; 2) Extra and costly processing steps are not required to deposit the diffusion source and remove it once the anneal has occurred; and 3) Diffusion occurs more rapidly and at lower temperatures since the diffusion sources are nanoparticles, the semiconductor matrix is initially porous (becomes less so during the fusing process), and the diffusion sources are distributed throughout the semiconductor matrix (less distance to travel). Even though FIG. 4 shows the shape of the semiconductor nanoparticle 410 to be a quantum rod or wire, it could be any colloidal nanoparticle that shows quantum size effects, including quantum dots, quantum rods, branched quantum rods, tetrapods, and any other multiply connected nanoparticles that show quantum confinement effects. Analogously, FIG. 4 shows the dopant material nanoparticle 420 to be a quantum dot, whereas, it can also be any colloidal nanoparticle, either singly or multiply connected, that shows quantum size effects.

In general the semiconductor nanoparticles 410 composing the ex-situ doped semiconductor layer 400 can be selected from type II-VI, III-V, IV-VI, or IV semiconductor materials. Specific type IV semiconductors are Si, Ge, and Sn. Specific type III-V semiconductors are AlN, AlP, AlAs, and AlSb; GaN, GaP, GaAs, and GaSb; and InN, InP, InAs, and InSb. Specific II-VI semiconductors are ZnS, ZnSe, and ZnTe; CdS, CdSe, and CdTe, HgS, HgSe, and HgTe. Specific IV-VI semiconductors are PbS, PbSe, and PbTe. These semiconductors can be doped with a well-known set of donor and acceptor atoms. For the invented low cost ex-situ doping process, dopant atom 310 selection is limited by the requirement that one can synthesize a nanoparticle composed solely of those atoms or shelled by those atoms. Accordingly, the common list of donors and acceptors gets slightly reduced to include only those elements whose state of matter at room temperature is either a metal or a semiconductor. Given this restriction, the type II-VI, III-V, IV-VI, and IV semiconductor materials can be doped by the invented ex-situ doping processes using the following list of dopant atoms. For type IV semiconductors, the dopant atoms 310 can be selected from group III or V materials. For type III-V semiconductors, the dopant atoms 310 can be selected from group IIa, IIb, IV, or VI materials. For type II-VI semiconductors, the dopant atoms 310 can be selected from group Ia, Ib, III, or V materials. For type IV-VI semiconductors, the dopant atoms 310 can be selected from group III or V materials. As can be seen from this list, group VII dopants have been excluded since they are gases at room temperature.

The colloidal semiconductor nanoparticles 410 are made by chemical methods well known in the art. Typical synthetic routes are decomposition of molecular precursors at high temperatures in coordinating solvents (C. B. Murray et al., Annu. Rev. Mater. Sci. 30, 545 (2000)), solvothermal methods (O. Masala and R. Seshadri, Annu. Rev. Mater. Res. 34, 41 (2004)) and arrested precipitation (R. Rossetti et al., J. Chem. Phys. 80, 4464 (1984)).

The colloidal dopant material nanoparticles 420 are also made by chemical methods well known in the art. As discussed above, the dopants can either be metal atoms (such as, Mg, Cu, Zn, or In) or semiconductor atoms (such as, Si, Ge, or Te). Colloidal synthesis of metallic nanoparticles of Au, Ag, and Cu and semiconductor nanoparticles of Si and Ge were reviewed by Masala et al. (O. Masala and R. Seshadri, Annu. Rev. Mater. Res. 34, 41 (2004)). Colloidal synthesis of Al nanoparticles was discussed by Jouet at al. (R. J. Jouet et al., Chem. Mater. 17, 2987 (2005)).

Having grown the semiconductor nanoparticles 410 and the dopant material nanoparticles 420, it is then advantageous to form a mixed dispersion of them and deposit the dispersion on a surface to form an ex-situ doped semiconductor layer 400. Typical dopant concentrations in semiconductors are in the 1 part in $10^4$ to $10^6$ range. However, it has been found that incomplete dopant atom activation typically occurs. As a result, the ratio of dopant material atoms to semiconductor atoms in the mixed dispersion is usually much greater than the 1 part in $10^4$ to $10^6$ range, with the range being as high as 1 part in $10^3$ to $10^2$ at times. In practice the proper ratio for achieving particular dopant (conductivity results for the doped semiconductor layer) activation needs to be determined by experimentation.

As is well known in the art, three low cost techniques for forming nanoparticle films are depositing the colloidal dispersion of inorganic nanoparticles 205 by drop casting, spin coating and inkjetting. Common solvents for drop casting inorganic nanoparticles 205 are a 9:1 mixture of hexane: octane (C. B. Murray et al., Annu. Rev. Mater. Sci. 30, 545 (2000)). The organic ligands 210 need to be chosen such that the inorganic nanoparticles 205 are soluble in non-polar solvents. As such, organic ligands with hydrocarbon-based tails are good choices, such as, the alkylamines. Using well-known procedures in the art, the ligands coming from the growth procedure (trioctylphosphine oxide, for example) can be exchanged for the organic ligand 210 of choice (C. B. Murray et al., Annu. Rev. Mater. Sci. 30, 545 (2000)). When spin coating a colloidal dispersion of inorganic nanoparticles 205, the requirements of the solvents are that they easily spread on the deposition surface and the solvents evaporate at a moderate rate during the spinning process. It was found that alcohol-based polar solvents are a good choice; for example, combining a low boiling point alcohol, such as, ethanol, with higher boiling point alcohols, such as, a butanol-hexanol mixture or 1-propanol, results in good film formation. Correspondingly, ligand exchange can be used to attach an organic ligand 210 (to the inorganic nanoparticles 205) whose tail is soluble in polar solvents; pyridine is an example of a suitable ligand.

The doped (either by the in-situ or ex-situ processes) semiconductor layers resulting from these three deposition processes are resistive since non-conductive organic ligands 210 separate either the in-situ doped semiconductor nanoparticles 305 or the semiconductor nanoparticles 410. In order to enhance the conductivity of the doped semiconductor layer, it is preferred that the organic ligands 210 attached to either the in-situ doped semiconductor nanoparticles 305 or the semiconductor 410 and dopant material 420 nanoparticles evaporate as a result of annealing the doped semiconductor layer in either an inert atmosphere or under vacuum. By choosing the organic ligands 210 to have a low boiling point (less than 200° C.), they can be made to evaporate from the film during an annealing process (C. B. Murray et al., Annu. Rev. Mater. Sci. 30, 545 (2000)) where the anneal temperature is below 220° C. Consequently, for films formed by drop casting with non-polar solvents, shorter chained primary amines, such as, hexylamine are preferred; for films formed by spin coating with polar solvents, pyridine is a preferred ligand.

Following the anneal step to boil off the organic ligands 210, the doped semiconductor layer remains resistive since there is poor connectivity between the inorganic nanoparticles 205 and electron and holes can get trapped by the nanoparticle's surface states. The issue of poor connectivity is alleviated by using the result that nanoparticles melt at much reduced temperatures compared to their bulk counterparts (A. N. Goldstein et al., Science 256, 1425 (1992)). Consequently, it is desirable that both the in-situ doped semiconductor nanoparticles 305 and the semiconductor nanoparticles 410 have diameters less than 5 nm in order to enhance the sintering process, with a preferred size of 1-3 nm. Typical annealing temperatures are between 250 and 500° C. The annealing can take place in either a tube furnace or a rapid thermal annealer, where a variety of gases (such as, nitrogen, argon, oxygen, hydrogen, or forming gas) can be used depending on the desired outcome. As is well known in the art, other heating apparatus can also be used to anneal the doped semiconductor layer. The trapping by surface states is also partially alleviated by the sintering process; however, many surface states remain after typical anneals.

For the ex-situ doping process, the second anneal at elevated temperatures serves an additional purpose. Namely, not only does it cause the semiconductor nanoparticles 410 to fuse and form a continuous semiconductor layer; but, simultaneously causes the dopant atoms 310 to diffuse out from the dopant material nanoparticles 420 and into the continuous semiconductor layer to provide appropriate doping so that the ex-situ doped semiconductor layer 400 is formed. One of the advantages of the ex-situ doping process is that the diffusion of the dopant atoms 310 occurs simultaneously with the fusing of the semiconductor nanoparticles 410 to form a continuous semiconductor layer.

In the simplest case a doped semiconductor junction 500 is a p-n homojunction. In addition to the p-n junction, the junction could be a p-p junction, an n-n junction, a p-i junction (where i refers to an intrinsic semiconductor), and an n-i junction. A junction may also be a semiconductor/metal junction (a Schottky junction), or a semiconductor/insulator junction. The junction may also be a junction of two different semiconductor materials (a heterojunction), a doped semiconductor to a doped or an undoped semiconductor, or a junction between regions having different dopant concentrations. The device layers including the junction can be any combination of type IV, II-VI, III-V, and IV-VI semiconductor materials, for example, a p-n junction formed from p-type II-VI and n-type III-V. Besides these single material possibilities, combinations of the semiconductor materials can be used for the device layers. An example is the n-layer composed of II-VI and III-V semiconductor materials.

A first semiconductor layer 510 of a doped semiconductor junction 500 can be formed by using either the in-situ or ex-situ doping processes (or a combination of the two). However, other possible processes, either in-situ or ex-situ, can be implemented for creating doped, nanoparticle-based, polycrystalline semiconductor junction layers. To form the doped semiconductor junction 500, a typical procedure is for the first semiconductor layer 510 (n- or p-type polarity) to be deposited on the substrate 100. The substrate 100 can be either rigid or flexible, transparent or opaque, and insulating or conductive. Standard semiconductor procedures are followed for cleaning the substrate 100 prior to coating the nanoparticle-based dispersions. As discussed above, the dispersions containing the inorganic nanoparticles 205 can be deposited by low cost processes, such as, drop casting, spin coating, or inkjetting, either under inert conditions or under ambient conditions. The coating process is followed by either one or two anneal steps. The low temperature anneal at temperatures below 220° C. boils away the organic ligands 210 and organic solvents, while making the first semiconductor layer 510 suitable for additional depositions on top of it. At that point either the second higher temperature anneal (between 250 to 500° C.) is performed or a second layer 520 of the junction is deposited. Prior to depositing the second layer 520 of the junction, standard semiconductor procedures are followed for cleaning the surface of the first semiconductor layer 510. If the depositions are performed in air, then additional well-known steps need to be taken to remove the surface oxides from the first semiconductor layer 510.

As discussed above, the second layer 520 of the junction can either be a doped semiconductor layer, an undoped (possibly intrinsic) semiconductor layer, a metal, or an insulator. If the second layer 520 is a semiconductor, its polarity can either be the same or different from the first semiconductor layer 510. If the second layer 520 is a semiconductor, then it can be of the same material (homojunction) or different material (heterojunction) from that of the first semiconductor layer 510. If the second layer 520 is a semiconductor, then it can be formed using the many well-known processes for depositing either amorphous, polycrystalline, or crystalline semiconductors. Some of these processes are MBE, MOCVD, chemical bath deposition, sputtering, thermal evaporation, chemical vapor deposition, plasma enhanced chemical vapor deposition, and closed-space sublimation. The second layer 520 can also be formed by the nanoparticle-based processes used to form the first semiconductor layer 510. As is well-known in the art, the second layer 520 could be deposited first on the substrate, followed by the first semiconductor layer 510. In addition, the second layer 520 could be the substrate. If the second layer 520 is formed by in-situ or ex-situ doping processes (or a combination of the two), then following its deposition the junction needs to be subjected to a low temperature anneal (below 220° C.) followed by a high temperature anneal (between 250 to 500° C.).

The following example is presented as further understandings of the present invention and is not to be construed as limitations thereon.

EXAMPLE 1

In this example the doped semiconductor junction 500 was formed between a p-Si substrate and an n-CdSe layer in-situ doped with In. The p-Si substrate had a resistivity of ~5 ohm-cm. Doped CdSe quantum wires 300 were formed by a procedure based on that by Pradhan et al. (N. Pradhan et al., Nano Letters 6, 720 (2006)) for forming undoped CdSe nanowires. In our version the cadmium precursor is cadmium acetate, the indium precursor is indium acetate hydrate, and the Se precursor is selenourea. In the synthesis equal molar ($1.27 \times 10^{-4}$ moles) amounts are used of the cadmium acetate and the selenourea. Experimentation revealed that the resistivity of the doped CdSe layer was lowest when the In molar concentration was 0.1% of the cadmium molar concentration. The coordinating solvent for the growth was octylamine (OA), which was degassed at 30° C. for 30 minutes prior to its usage.

To form the cadmium precursor, in a small vial inside of a dry box, 0.03 g of cadmium acetate was added to 4 ml OA. After gently heating this mixture under constant spinning, the solution went clear in 5-10 minutes. To form the indium precursor, indium acetate hydrate was added to OA in a small vial to make a $6.2 \times 10^{-4}$ M solution. Following gentle heating with continuous stirring, the mixture turned clear after 5-10 minutes. In order to add 0.1% of indium precursors to the cadmium precursor solution, 200 µl of the $6.2 \times 10^{-4}$ M solution was added to a three-neck flask along with the cadmium precursor solution. The three-neck flask was then placed on a Schlenk line and at room temperature the contents were subjected to three cycles of evacuation, followed by argon refilling. After the third cycle, the flask contents were taken up to 120° C. To prepare the Se precursor, 0.016 g of selenourea was added to 550 µl of OA in a small vial inside of a dry box. After gentle heating and continuous stirring, the solution goes clear in 10 minutes. The selenourea solution was transferred to a syringe and injected into the three-neck flask, whose contents were at 120° C. The flask mixture turned a deep red within seconds of the injection. Under slow stirring the growth of doped CdSe quantum wires was continued for 4-6 hours at 120° C., followed by a final 20 minute anneal at 140° C. The doped wire emission (green-yellow) is clearly visible in room lights, though less bright than typical CdSe quantum dots.

After having formed the 0.1% In doped quantum wire crude solution, a dispersion was created with alcohols as the solvents. More specifically, ~1-2 ml of crude solution was added to 3 ml of toluene, and 10 ml of methanol in a centrifuge tube. After centrifuging for a few minutes, the supernatant became clear. It was decanted off and 3-4 ml of pyridine was added. The plug quickly dissolved in the pyridine to produce a clear solution. The solution was heated at 80° C. under continuous stirring for 24 hours in order to exchange the OA organic ligands 210 for pyridine organic ligands 210. Some of the excess pyridine was then removed by a vacuum prior to adding ~13 ml of hexane to the pyridine solution. This solution was then centrifuged, the supernatant decanted, and a mixture of 1-propanol and ethanol was added to the plug in order to get a clear dispersion.

To form p-n diode devices with p-Si, ~19 mm square p-Si pieces were cleaned by rinsing in acetone, methanol, and water and then blown dry with nitrogen. Next they were etched in 5:1 buffered HF for 30 seconds (to remove surface oxides), followed by rinsing with water and blowing dry with nitrogen. Following the etch step, the p-Si pieces were immediately placed in a thermal evaporator. After attaining a vacuum level of $10^{-6}$ Torr, 100 nm of Al was deposited on the backside of the p-Si pieces.

Prior to drop casting the doped quantum wire dispersion on the front side of the p-Si pieces, the pieces were once more cleaned by acetone, methanol and water and then etched in 5:1 buffered HF for 30 seconds. Following the oxide etch step, the p-Si pieces were immediately placed in a dry box to prevent oxide formation on the cleaned front Si surface. Subsequent to drop casting the dispersion on the p-Si pieces, the diodes were annealed in a tube furnace (with flowing argon) at 160° C. for 30 minutes (to boil off the pyridine ligands), followed by 300° C. for 45 minutes in order to sinter the doped CdSe quantum wires amongst themselves and onto the p-Si surface. Next, contact metals were thermally evaporated onto the n-CdSe film surface through a shadow mask. Prior to metal evaporation, the films were rinsed with acetone, methanol, and water and blown dry with nitrogen. The evaporated metals (in deposition order) were 50 nm of In, 40 nm of Cr, and 350 nm of Au. Indium is a well-known ohmic contact for CdSe, while the Au was deposited in order to aid in probing the ohmic contacts. The metals were deposited at a vacuum level of ~$10^{-6}$ Torr. The contacts were then annealed in a tube furnace under flowing argon for 5 minutes at 240° C.

Figure 6:
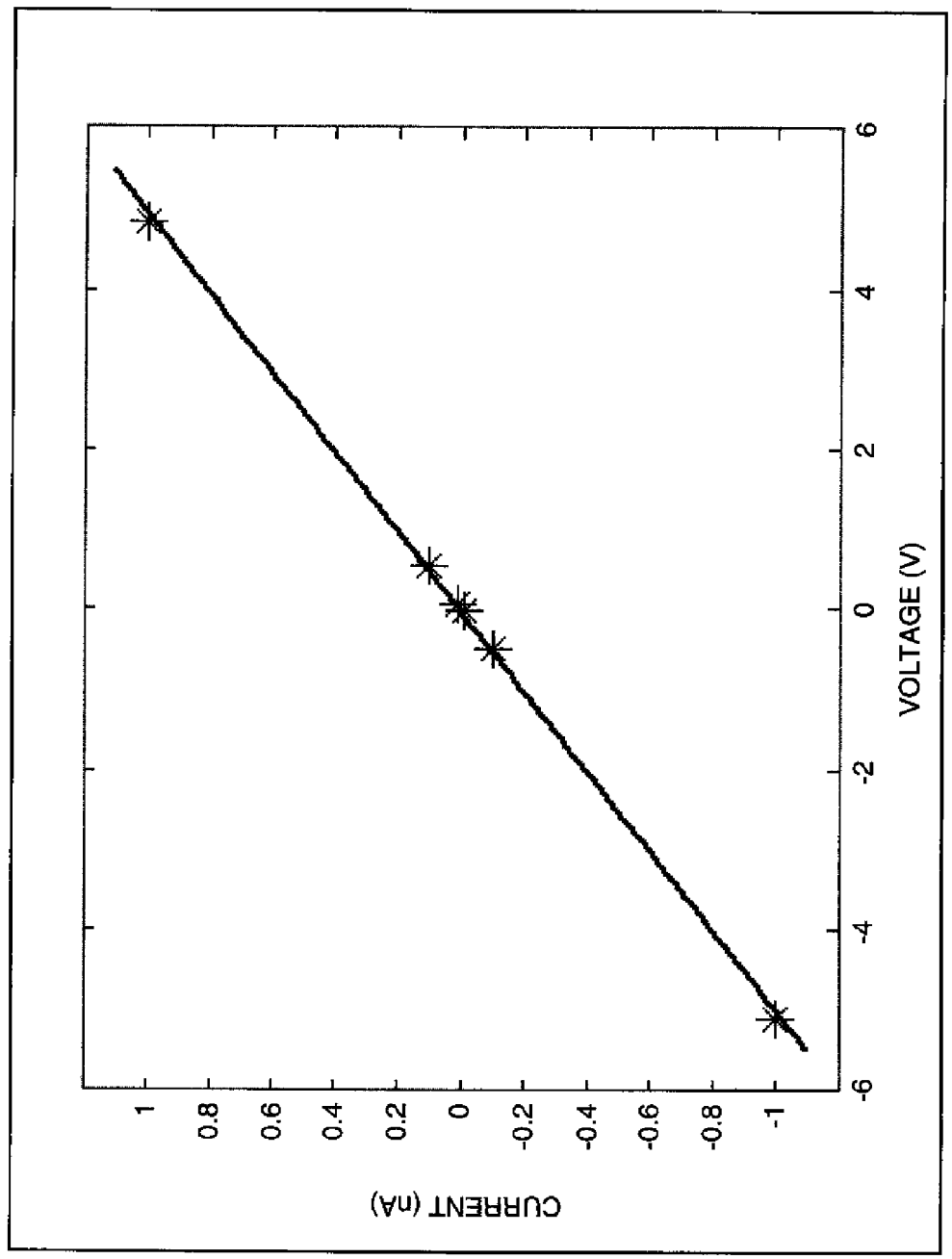
FIG. 6 gives the IV response for a two-point probe measurement of film resistance for doped CdSe quantum wires.

Separately it was verified, by depositing the films on borosilicate glass, that ohmic contacts were formed between the deposited metals and the doped CdSe films. FIG. 6 gives the IV characteristics of a two-point probe measurement made between separated metal contacts on the film surface. Evidence for ohmic contact formation is that the IV trace is linear over a large dynamic range for positive and negative currents. The measurements were made using a combination of a Keithley 6220 precision current source and a Keithley 6514 electrometer. From FIG. 6 the extracted resistance is 4.8 Gohms.

Combining this result and those made on other samples by 4-point probe techniques resulted in an average film resistivity value of $1.8 \times 10^5$ ohm-cm for the doped CdSe films.

Figure 7:
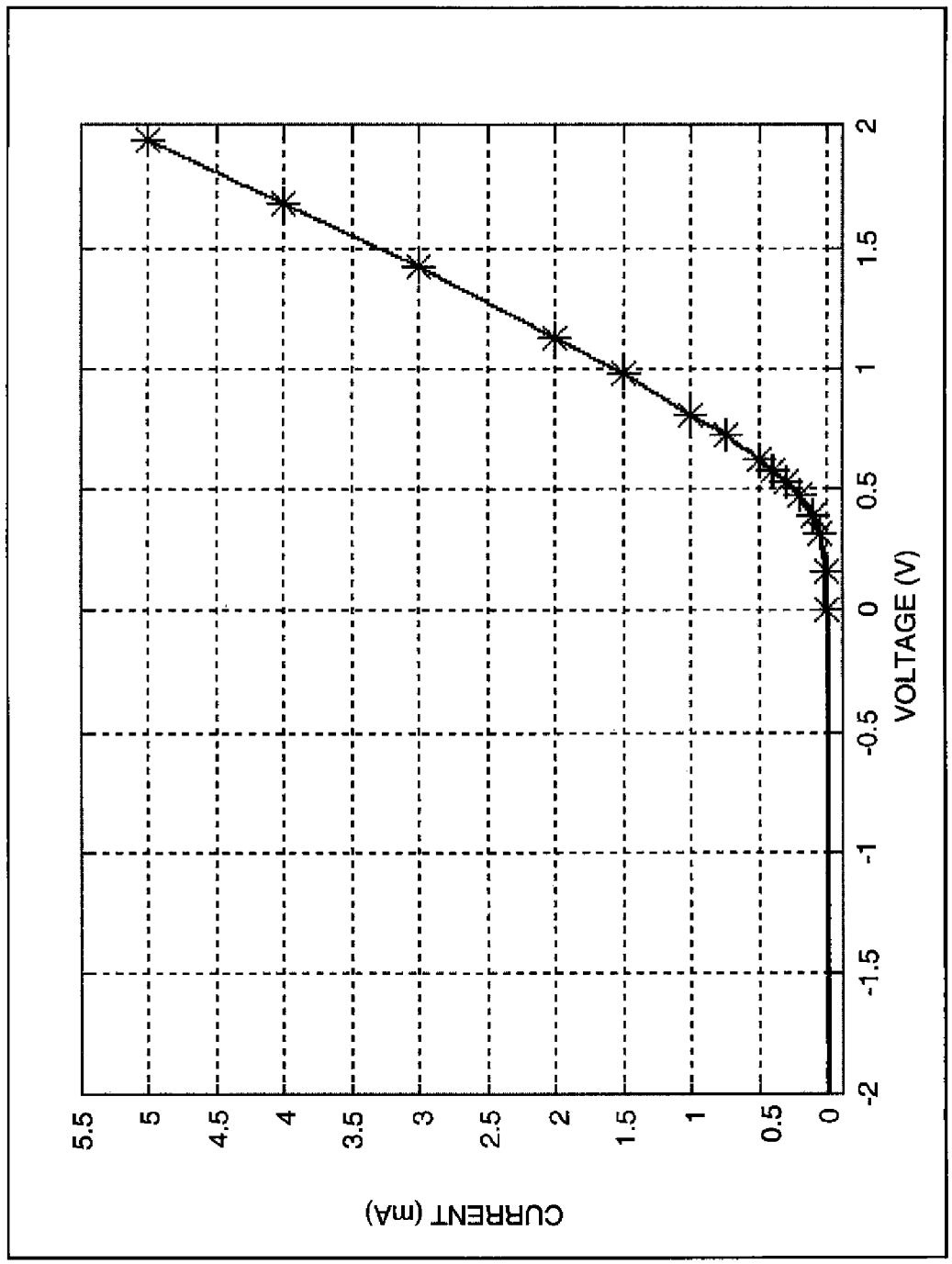
FIG. 7 gives the IV response curve for an n-CdSe:p-Si diode device.

Finally, IV curves were generated for the n-CdSe:p-Si devices. FIG. 7 shows a representative IV response curve. In the figure the symbols are the data, while the solid line is the fit to the data. The curve shows that the turn-on voltage is ~0.3 V. At a voltage of −16 V, the reverse current is −50 μA. The diode's forward bias series resistance is ~250 ohms.

EXAMPLE 2

In this example the doped semiconductor junction 500 was formed between a p-ZnTe layer ex-situ doped with Cu and an n-Si substrate. The n-Si substrate had a resistivity of ~5 ohm-cm. Undoped ZnTe semiconductor nanoparticles 410 were synthesized by adapting the procedures commonly used to form ZnSe spherical dots (M. A. Hines et al., J. Phys. Chem. B102, 3655 (1998)). More specifically, 4 g of dried and degassed hexadecylamine (HDA) was placed in a three-neck flask and heated, under argon, to 290° C. on a Schlenk line. For the Te precursor, a 0.25 M solution (called TOPTe) of Te in trioctylphosphine (TOP) was formed by heating under vacuum a mixture of Te powder and TOP at 190° C., while vigorously stirring for ~3-4 hours. The resulting solution was clear and had a green-yellow appearance. In a dry box, a syringe was filled with 0.4 mmol of diethylzinc (from a 1 M diethylzinc in hexane solution), 1.6 mmol of TOPTe, and 2.0 ml of additional TOP. The syringe contents were quickly injected into the three-neck flask, while the solution was vigorously stirred. As a result of injecting the room temperature Zn/Te stock solution, the reaction temperature immediately fell ~25° C. It was maintained at 265° C. for 10 minutes in order to form orange-red emitting ZnTe nanocrystals (viewable in room lights). The UV-VIS absorption spectrum of the ZnTe quantum dot crude solution showed that the dots had a distinct room temperature first exciton absorption peak at ~430 nm.

The literature procedure of Hambrock et al. (J. Hambrock et al., Chem. Commun. 69 (2002)) was followed for forming the copper nanoparticles. In that procedure the copper precursor species is copper alkoxide. To form the copper alkoxide, the synthesis process of Singh et al. (J. V. Singh et al., Z. Anorg. Allg. Chem. 477, 235 (1981)) was modified according to the following procedure. A 500-mL round-bottomed flask was equipped with a magnetic stirring bar and a vigerux column. To the flask was added 50 ml of N,N-dimethylamino-2-propanol, 250 ml of toluene and 2.0 g (0.016 mol) of copper methoxide. The mixture was heated to reflux. For 4 hours at 65-100° C. the solvent was distilled off while under a nitrogen overpressure; the rest of the solvent was distilled off under vacuum. The remaining dark residue was dried under high vacuum and then transferred to a dry box, where it was placed in a sublimation boat. The residue was sublimed to obtain 3.0 g of dark purple crystals (64% yield).

Following Hambrock et al. (J. Hambrock et al., Chem. Commun. 68 (2002)), a 0.3 M solution of copper alkoxide in degassed octylamine was prepared (it was dark brown). 7 g of HDA (dried and degassed) was then placed in a three-neck flask and heated to 300° C. (under nitrogen) on a Schlenk line. While vigorously stirring the HDA at 300° C., 4 ml of the 0.3 M copper precursor solution was rapidly injected into the three-neck flask. Upon injection of the copper precursor solution, the reaction mixture immediately turned a dark red color. After the injection the flask contents cooled to 225° C., where it was left stirring for 30 minutes. The UV-VIS absorption spectrum of the copper crude solution showed the copper nanoparticle plasmon peak to be at ~565 nm, in agreement with the results of Hambrock et al. (J. Hambrock et al., Chem. Commun. 68 (2002)). TEMs indicated that the copper nanoparticles were spherical with particle diameters ranging between 6 and 12 nm.

After having formed the ZnTe and Cu nanoparticles, dispersions were created with alcohols as the solvents. For the ZnTe nanoparticles, ~1-2 ml of crude solution was added to 3 ml of toluene, and 10 ml of methanol in a centrifuge tube. After centrifuging for a few minutes, the supernatant became clear. It was decanted off and 3-4 ml of pyridine was added. The plug quickly dissolved in the pyridine to produce a clear solution. The solution was heated at 80° C. under continuous stirring for 24 hours in order to exchange the TOP and HDA organic ligands 210 for pyridine organic ligands 210. Some of the excess pyridine was then removed by a vacuum prior to adding ~13 ml of hexane to the pyridine solution. This solution was then centrifuged, the supernatant decanted, and a mixture of 1-propanol and ethanol was added to the plug in order to get a clear dispersion. For the Cu nanoparticles, an analogous procedure was followed for replacing the amine organic ligands 210 with pyridine organic ligands 210, to produce a dispersion in 1-propanol.

In order to form the Cu-doped ZnTe layer, mixed dispersions, containing appropriate ratios of ZnTe to Cu nanoparticles, had to be formed. Various ratios of ZnTe to Cu nanoparticles were tried in order to minimize the resistivity of the Cu-doped ZnTe layer. The best results were obtained for a mixed dispersion containing a ratio of ZnTe to Cu nanoparticles of ~35:1.

Prior to forming the Cu-doped ZnTe films on the n-Si substrates, additional tests were run on the undoped ZnTe and Cu nanoparticles. For the ZnTe nanoparticles the corresponding alcohol-based dispersion was spin coated in air on pre-cleaned borosilicate glass. Using a tube furnace with flowing argon, the nanoparticle-based film was annealed at 160° C. for 30 minutes (to boil off the pyridine ligands), followed by 300° C. for 30 minutes (to sinter the ZnTe nanoparticles). X-ray diffraction analysis of the film revealed it to be cubic ZnTe. Application of the Scherrer formula to the (111) peak revealed that the average crystallite size of the ZnTe was 3.4 nm. For the Cu nanoparticles corresponding films were made in order to verify that highly conductive, metallic films could be formed. Since Cu oxidizes very rapidly in air, the Cu dispersions were drop casted on the pre-cleaned borosilicate glass inside of a dry box. Using a tube furnace with flowing argon, the Cu film was annealed at 160° C. for 30 minutes, followed by 300° C. for 30 minutes. A two-point probe was then employed to measure the resistance of the annealed Cu films. With the probe tips being 1 cm apart, the measured resistance was ~10 ohms. Though not as low as bulk metal films (~2-3 ohms), the resulting film resistance was sufficiently small to verify that the nanoparticles were metallic and that the films did not contain a significant amount of undesirable organic contaminants.

Next the p-ZnTe:n-Si diodes were formed. As discussed in Example 1, an analogous procedure was followed for cleaning (and etching) the 19 mm square n-Si pieces, depositing 100 nm of Al on their backside, and then cleaning (and etching) their front side in preparation for drop casting the mixed dispersion of Cu and ZnTe nanoparticles. Because of the air sensitivity of Cu, the drop casting was performed in a dry box. Using a tube furnace with flowing argon, the diodes were annealed at 160° C. for 30 minutes (to boil off the pyridine ligands), followed by 450° C. for 30 minutes (to sinter the ZnTe nanoparticles amongst themselves and onto the n-Si surface). Ohmic contacts (2 mm squares) were deposited on the surface of the Cu-doped ZnTe films through a contact mask in order to enable measurement of the diodes' IV characteristics. The metals (in deposition order) consisted of 150 nm of Pd (sputtered) and 300 nm of Ag (thermally evaporated). Palladium is a well-known ohmic contact for ZnTe, while the Ag was deposited in order to aid in probing the ohmic contacts. Prior to metal evaporation, the films were cleaned with acetone, methanol, and water, and then blown dry with nitrogen. The contacts were annealed in a tube furnace under flowing argon for 5 minutes at 240° C.

Figure 8:
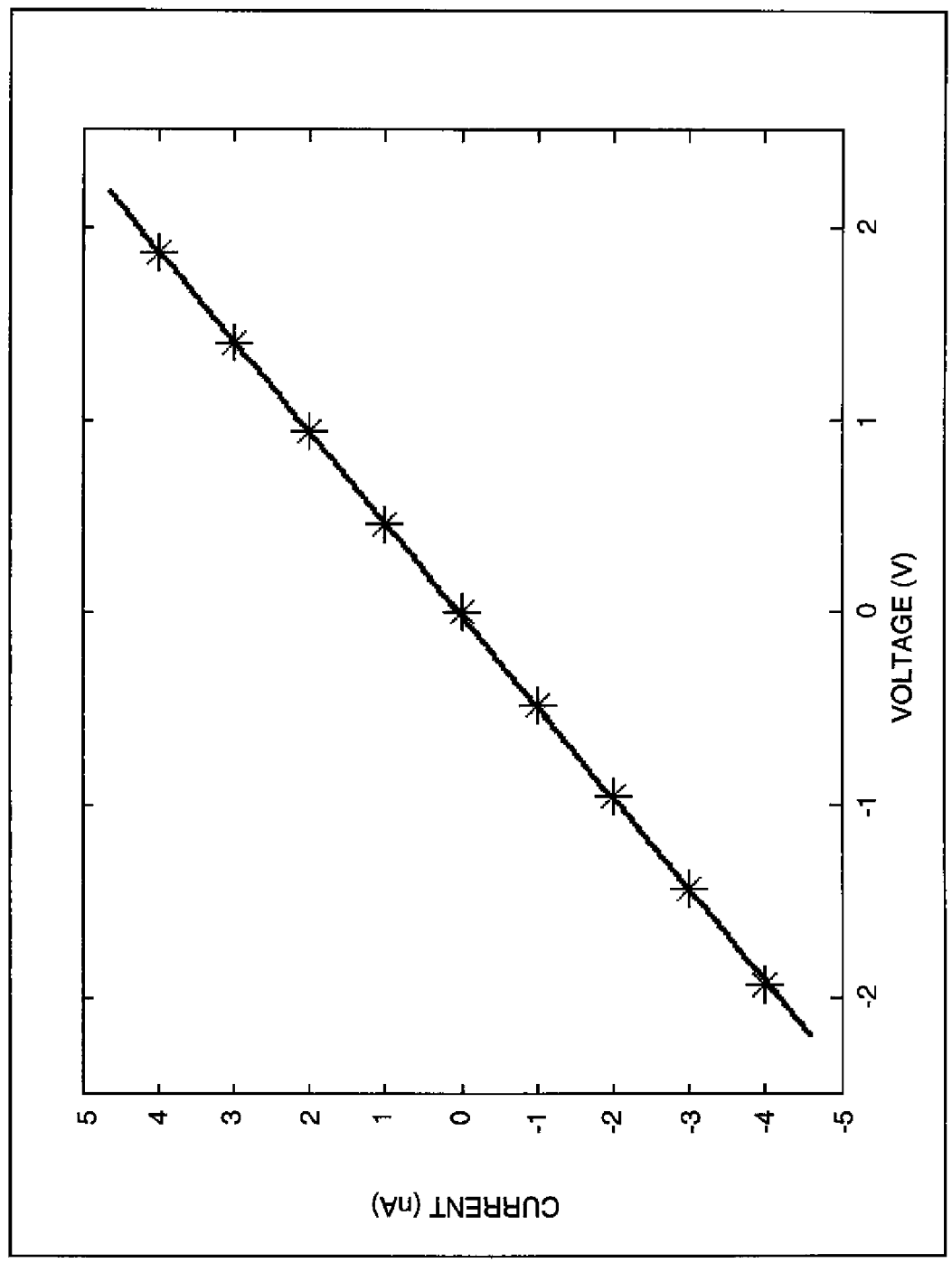
FIG. 8 gives the IV response for a two-point probe measurement of film resistance of Cu-doped ZnTe.

Separately it was determined, by depositing the films on borosilicate glass, that ohmic contacts were formed between the deposited metals and the Cu-doped ZnTe films. FIG. 8 gives the IV characteristics of a two-point probe measurement made between separated metal contacts on the film surface. Evidence for ohmic contact formation is that the IV trace is linear for positive and negative currents. The measurements were made using a combination of a Keithley 6220 precision current source and a Keithley 6514 electrometer. From FIG. 8 the extracted resistance is 0.46 Gohms. Combining this result and those made on other samples by 4-point probe techniques resulted in an average film resistivity value of $3.8 \times 10^4$ ohm-cm for the Cu-doped ZnTe films.

Figure 9:
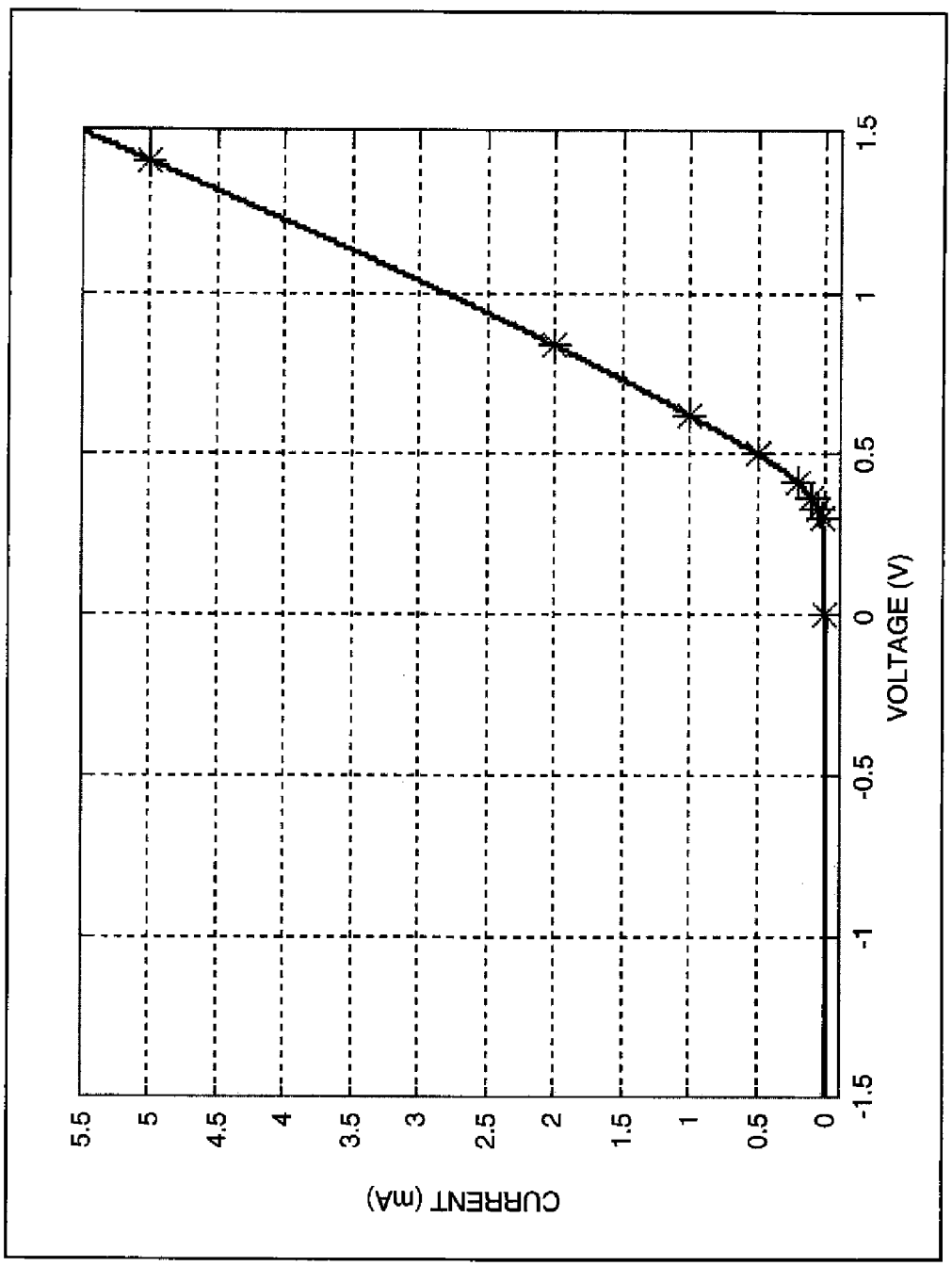
FIG. 9 gives the IV response curve for an p-ZnTe:n-Si diode device.

Finally, IV curves were generated for the p-ZnTe:n-Si devices. FIG. 9 shows a representative IV response curve. In the figure the symbols are the data, while the solid line is the fit to the data. The curve shows that the turn-on voltage is ~0.3 V. At a voltage of −10.1 V, the reverse current is −20 µA. The diode's forward bias series resistance is ~190 ohms.

EXAMPLE 3

In the final example the doped semiconductor junction 500 was formed between a p-ZnTe layer ex-situ doped with Cu and an n-CdSe layer in-situ doped with In. For ease of contacting the n-CdSe, it was deposited on n-Si, instead of glass. Thus, the total diode structure was p-ZnTe:n-CdSe:n-Si. Both the Cu-doped ZnTe layer and the In-doped CdSe layer were formed using the same dispersions employed for Examples 2 and 1, respectively. Starting with 19 mm square n-Si pieces, analogous procedures (see Examples 1 and 2) were followed for applying Al metal to the n-Si backside and drop casting both nanoparticle-based dispersions. All of the drop castings were performed in a dry box in order to prevent oxide formation on the semiconductor surfaces. Prior to drop casting the mixed Cu and ZnTe dispersion on the n-CdSe film surface, the film surface was washed with acetone and methanol. After the In-doped n-CdSe film deposition, the diode was annealed as described in Example 1; after the Cu-doped p-ZnTe film deposition, the diode was annealed as described in Example 2. The procedure described in Example 2 for depositing and annealing Pd/Ag was followed for applying ohmic contacts to the p-ZnTe.

Figure 10:
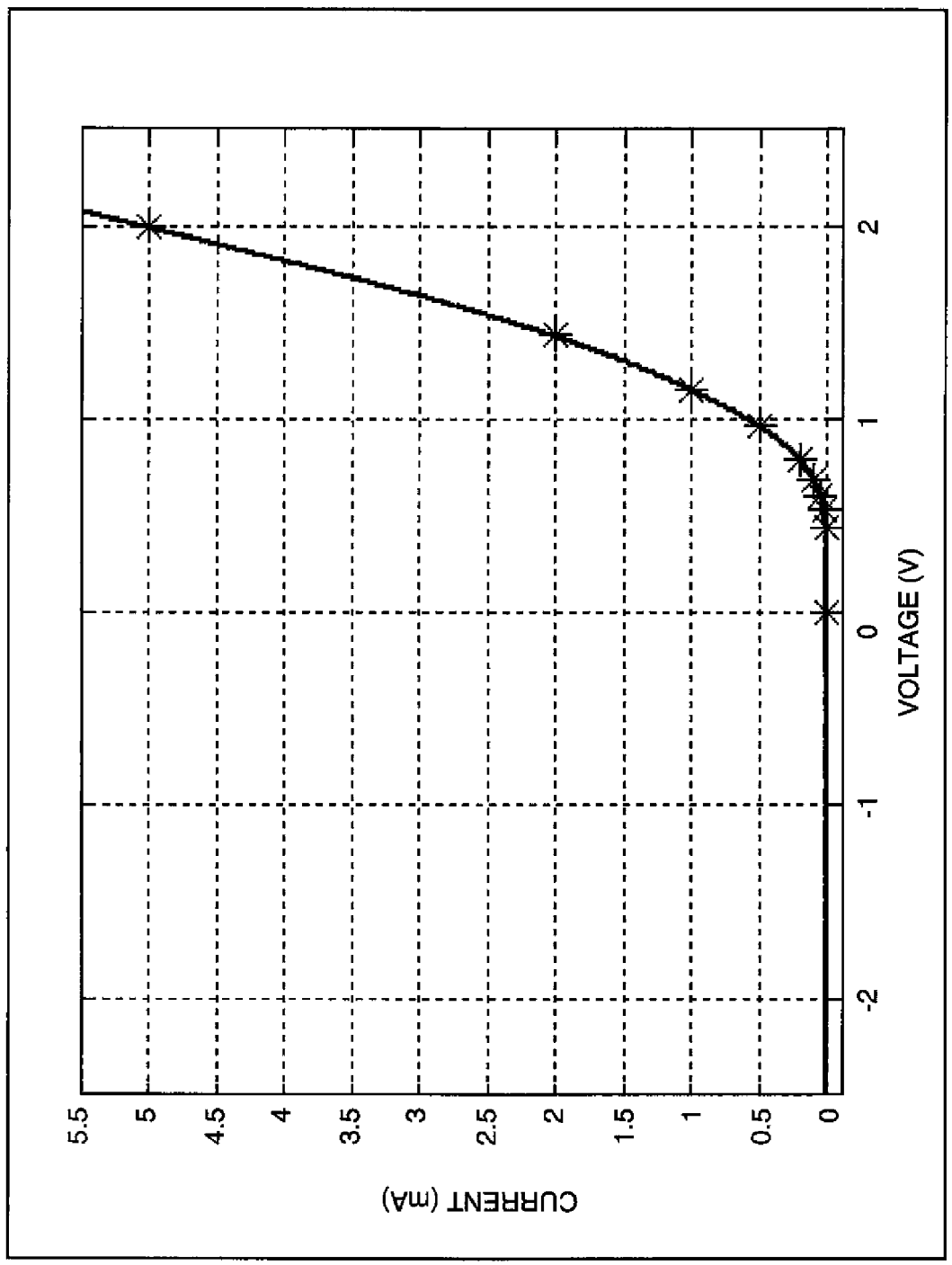
FIG. 10 gives the IV response curve for an p-ZnTe:n-CdSe: n-Si diode device.

IV curves were generated for the p-ZnTe:n-CdSe:n-Si devices. FIG. 10 shows a representative IV response curve. In the figure the symbols are the data, while the solid line is the fit to the data. The curve shows that the turn-on voltage is ~0.65 V. At a voltage of −16 V, the reverse current is −500 nA. The diode's forward bias series resistance is 183 ohms.

In summary, all three examples show that doped nanoparticle-based diode devices can be fabricated using low cost processes and produce polycrystalline semiconductor junctions having good performance characteristics.

The invention has been described in detail with particular reference to certain preferred embodiments thereof, but it will be understood that variations and modifications can be effected within the spirit and scope of the invention.

PARTS LIST 100 substrate
105 light emitting diode device
110 p-contact layer
120 p-transport layer
130 intrinsic emitter layer
140 n-transport layer
150 n-contact layer
160 anode
170 cathode
200 semiconductor core
205 inorganic nanoparticle
210 organic ligand
300 quantum wire
305 in-situ doped semiconductor nanoparticle
310 dopant atom
400 ex-situ doped semiconductor layer
410 semiconductor nanoparticle
420 dopant material nanoparticle
430 semiconductor layer
500 doped semiconductor junction
510 first semiconductor layer
520 second layer

The invention claimed is:

1. A method of making a doped semiconductor junction for use in an electronic device comprising:
   (a) forming a first polycrystalline semiconductor layer in-situ doped with donors or acceptors over a substrate such that the first doped semiconductor layer has a first polarity, the first layer including colloidal semiconductor nanoparticles, comprising:
      (i) growing in-situ doped colloidal semiconductor nanoparticles having surface organic ligands in a colloidal solution;
      (ii) depositing the in-situ doped colloidal semiconductor nanoparticles on the substrate;
      (iii) performing a first anneal of the deposited in-situ doped colloidal semiconductor nanoparticles so that surface organic ligands with boiling points less than 200° C. boil off the surface of the in-situ doped colloidal semiconductor nanoparticles; and
   (b) forming a second layer in contact with the first semiconductor layer over a substrate to form the semiconductor junction; and
   (c) performing a second anneal of the deposited in-situ doped colloidal semiconductor nanoparticles, either before or after forming the second layer, whereby the in-situ doped colloidal semiconductor nanoparticles are fused so that a continuous doped semiconductor layer is formed.

2. The method of claim 1 wherein the first anneal is performed at temperatures below 220° C.

3. The method of claim 1 wherein the second anneal is performed at temperatures between 250° C. and 500° C.

4. A method of making a doped semiconductor junction for use in an electronic device comprising:
   (a) forming a first polycrystalline semiconductor layer ex-situ doped with donors or acceptors over a substrate such that the first doped semiconductor layer has a first polarity, the first layer including colloidal semiconductor nanoparticles, comprising:
      (i) growing a first set of colloidal semiconductor nanoparticles having surface organic ligands in a colloidal solution;

(ii) growing a second set of dopant material colloidal nanoparticles having surface organic ligands in a colloidal solution;

(iii) depositing a mixture of the first set of colloidal semiconductor nanoparticles and the second set of dopant material colloidal nanoparticles on the substrate, wherein there are more colloidal semiconductor nanoparticles than dopant material colloidal nanoparticles;

(iv) performing a first anneal of the deposited mixture of colloidal nanoparticles so that surface organic ligands with boiling points less than 200° C. boil off the surfaces of the first and second set of colloidal nanoparticles;

(b) forming a second layer in contact with the first semiconductor layer over a substrate to form the semiconductor junction; and (c) performing a second anneal of the deposited mixture, either before or alter forming the second layer, so that the colloidal semiconductor nanoparticles fuse to form a continuous semiconductor layer and the dopant material atoms diffuse out from the dopant material colloidal nanoparticles and into the continuous semiconductor layer to provide an ex-situ doped semiconductor layer.

5. The method of claim 4 wherein the first anneal is performed at temperatures below 220° C.

6. The method of claim 4 wherein the second anneal is performed at temperatures between 250° C. and 500° C.

\* \* \* \* \*